US006939736B2

(12) United States Patent
Grabham et al.

(10) Patent No.: US 6,939,736 B2
(45) Date of Patent: Sep. 6, 2005

(54) IDEAL OPERATIONAL AMPLIFIER LAYOUT TECHNIQUES FOR REDUCING PACKAGE STRESS AND CONFIGURATIONS THEREFOR

(75) Inventors: Marty A. Grabham, McKinney, TX (US); Brian Lance Clinton, Pottsboro, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/631,800

(22) Filed: Jul. 31, 2003

(65) Prior Publication Data

US 2005/0026322 A1 Feb. 3, 2005

(51) Int. Cl.[7] .................. H01L 21/44; H01L 21/00; H01L 29/84; H01L 35/00; H03F 3/26
(52) U.S. Cl. ............... 438/106; 438/151; 438/164; 438/1; 438/29; 438/149; 257/254; 257/273; 327/513; 327/378; 327/539; 327/541; 327/316; 330/207; 330/266
(58) Field of Search ................. 327/539, 541, 327/316, 540, 313, 315, 513, 378; 438/106, 151, 164, 1, 29, 149; 330/207, 266; 257/254, 273

(56) References Cited

U.S. PATENT DOCUMENTS

| 4,599,634 | A | * | 7/1986 | Culmer et al. ............... 257/254 |
| 4,717,890 | A | | 1/1988 | Davis et al. ................. 330/307 |
| 4,908,527 | A | * | 3/1990 | Van Antwerp ............... 327/511 |
| 5,504,458 | A | * | 4/1996 | Van Brunt et al. ........... 330/255 |
| 5,623,232 | A | * | 4/1997 | Halbert et al. ............... 330/307 |
| 5,627,495 | A | * | 5/1997 | Halbert et al. ............... 330/307 |
| 5,818,295 | A | * | 10/1998 | Chimura et al. ............. 327/561 |
| 6,058,223 | A | * | 5/2000 | Strohbehn .................... 382/312 |
| 6,075,407 | A | * | 6/2000 | Doyle ......................... 327/539 |
| 6,104,231 | A | * | 8/2000 | Kirkpatrick, II ............. 327/513 |
| 6,392,636 | B1 | * | 5/2002 | Ferrari et al. ................ 345/173 |
| 6,489,847 | B1 | * | 12/2002 | van Zeijl ..................... 330/255 |
| 6,519,371 | B1 | * | 2/2003 | Pain et al. ................... 382/288 |

* cited by examiner

*Primary Examiner*—Matthew Smith
*Assistant Examiner*—Igwe U. Anya
(74) *Attorney, Agent, or Firm*—Wade James Brady, III; Frederick J. Telecky, Jr.

(57) ABSTRACT

A method of reducing package stress includes placing matched components of an op-amp substantially in a region of a die having the least stress gradients. The region is located in the center of the die. Further, the center is the common centroid of the die. The matched components are the current mirror input stages of the op-amp. In one embodiment, a semiconductor configuration includes a die having a region with the least stress gradients, and an op-amp containing matched components that are located substantially in the region.

21 Claims, 2 Drawing Sheets

IDEAL OPERATIONAL AMPLIFIER LAYOUT TECHNIQUES FOR REDUCING PACKAGE STRESS AND CONFIGURATIONS THEREFOR

FIELD OF THE INVENTION

The present invention generally relates to reducing package stress and more particularly relates to operational amplifier (op-amp) layout techniques for reducing package stress.

BACKGROUND OF THE INVENTION

The performance characteristics of many linear and mixed signal integrated circuits are primarily dependent on the matching characteristics of current mirrors and differential amplifiers. In order to achieve a low offset voltage from an operational amplifier, the input transistors should be laid out identically. Otherwise, a DC offset may develop at the output of the circuit.

In many op-amp applications, it is desirable to minimize the variance of the op-amp input offset voltage. Assembly induced package stress is the key factor behind many assembly and test (A/T) yield problems for operational amplifier devices. The primary component for the assembly induced shifts is mold compound. The contracting of the compound causes stress on the active components of the op-amp, which creates large input offset voltage (VIO) variances. The wide swings in VIO introduce, in some cases, unacceptable yield losses during the final test.

In order to understand the impact of package stress, one should understand the key parameter of an op-amp, which is mostly affected by the stress. A general-purpose op-amp specifies an input offset voltage (VIO). This parameter is the DC voltage that must be applied to the input terminals to cancel the DC offset within the op-amp in order to force the quiescent DC output voltage to a specified level.

Further, an input offset mismatch in the input stage (i.e., transistors and other components) during the fabrication of the silicon die creates effects that produce a mismatch of the bias currents flowing through the input stage, which results in a differential voltage (Vd). The parameter VIO itself determines the accuracy of a particular op-amp's performance. In a typical application, the smaller the VIO, the better the performance characteristics. Most op-amps have a precision-mirrored, two-sided design input-stage. This reduces the changes in the output voltage, which ensures uniform changes due to stress levels.

Accordingly, careful planning of the design layout improves the performance of the VIO with respect to the package shift. One of the important aspects of the performance of differential amplifiers is the minimum DC differential voltage that can be detected. The presence of mismatched components within the amplifier itself and the drifts of its values with temperature produce differential voltages at the output. This causes the output signal to be unrecognizable from the signal being amplified. In most analog systems, this type of DC error is the basic limitation on the solution of the system.

Therefore, the consideration of mismatch-induced offsets is centralized to the design of analog circuits. The DC performance and the effects of mismatches are represented by the quantities of the input offset voltage and current.

Typically, the predominant causes of offset error, from a process viewpoint, lie in the emitter-coupled transistor pair. The mismatches are in the base width, base-doping level, and collector doping level of the transistors, and further are in the effective emitter area of the transistors and the collector load resistors.

Because silicon is piezoresistive (i.e., under stress, it exhibits resistivity changes), the variations in stress produce changes in resistor-matching across the die. Some layout techniques have been developed to minimize resistor stress sensitivity. A linear design can vary from one to the next, since different forms of packaging material produce different modulus (thermal) characteristics. The thermal expansion of plastic encapsulation is approximately ten times that of silicon. As the encapsulated package cools, it creates a difference between the coefficients of thermal expansion of silicon. This causes the epoxy to remain frozen in the packaged device, which generates "residual stresses", as shown in FIGS. 1A–1C.

The input offset voltage measurements during pre- and post-package reveal differences, known as "package shifts", which are proportional to the amount of the residual stresses. Package shift lowers the input offset voltage precision of the device, which raises test yield issues. Through the careful planning and layout of a linear design circuit, the sensitivity of the circuit can be configured so as to reduce the magnitude of the package shifts.

Conventional solutions related to the "package stress" problems include die potting, lower stress mold compounds, and pre-package trimming. However, there is no existing solution that provides a design layout recommendation, which takes "package shift" into consideration even before producing the material.

Therefore, a need exists to overcome the problems with the prior art as discussed above.

SUMMARY OF THE INVENTION

According to one aspect of the present invention, a method of reducing package stress includes placing matched components of an op-amp substantially in a region of a die having the least stress gradients. The region is located in the center of the die. Further, the center is the common centroid of the die. The matched components are the current mirror input stages of the op-amp.

According to another aspect of the present invention, a semiconductor configuration includes a die having a region with the least stress gradients, and an op-amp containing matched components that are located substantially in the region.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of the present invention.

DETAILED DESCRIPTION

As stated above, conventional op-amps do not use ideal layout techniques with respect to the current mirror input stages. However, location and orientation-matched devices should be placed in the areas of the die where the stress gradients are the smallest. Typically, the best location for matched components is the center of the die. It is not preferable to place critical components near the corners, where the stress intensity and gradients reach the maximum values.

For operational amplifiers, the critical components include the input stage. Thus, if possible, it is preferable to place the input stages as close to the center of the die as possible. This is considered the prime real estate for the design of operational amplifier devices. Accordingly, it is advantageous to locate the input stages near the common centroid of the die, and away from the periphery of the die.

Implementation Embodiments

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover, these embodiments are only examples of the many advantageous uses of the innovative teachings herein. In general, statements made in the specification of the present application do not necessarily limit any of the various claimed inventions. Moreover, some statements may apply to some inventive features, but not to others. In general, unless otherwise indicated, singular elements may be in the plural and vice versa with no loss of generality.

The scope of the present invention in its many embodiments is defined in the appended claims. Nonetheless, the invention and its many features may be more fully appreciated in the context of exemplary implementations disclosed and described herein which combine one or more embodiments of the invention with other concepts, architectures, circuits, and structures to achieve better results than previously achievable.

Figure 1A:
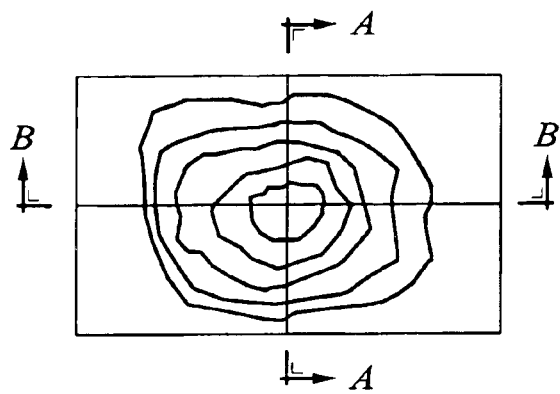
FIGS. 1A–1C are graphs showing distribution of package stress across a conventional integrated circuit.
Figure 1B:
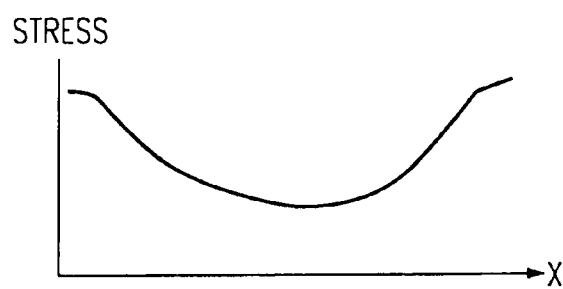
Figure 1C:
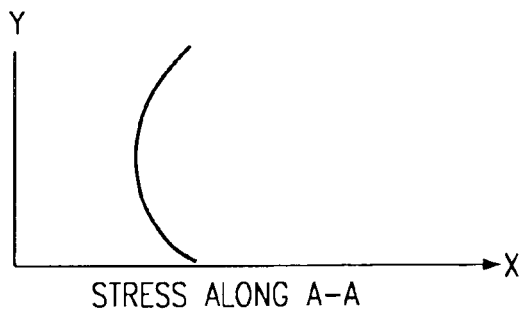
Figure 2:
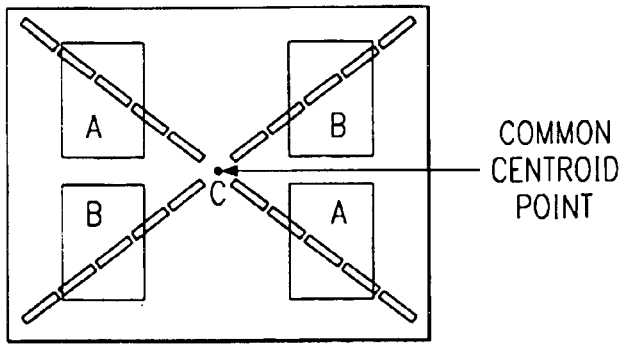
FIG. 2 is a simplified diagram illustrating stress gradients from a package viewpoint, according to the present invention.

Referring now to the drawings, FIG. 2 is a simplified diagram illustrating stress gradients (from a package viewpoint) of an op-amp device 200, according to one embodiment of the present invention. The op-amp device 200 has cross-coupled input stages ABBA, located near the common centroid C.

Figure 3:
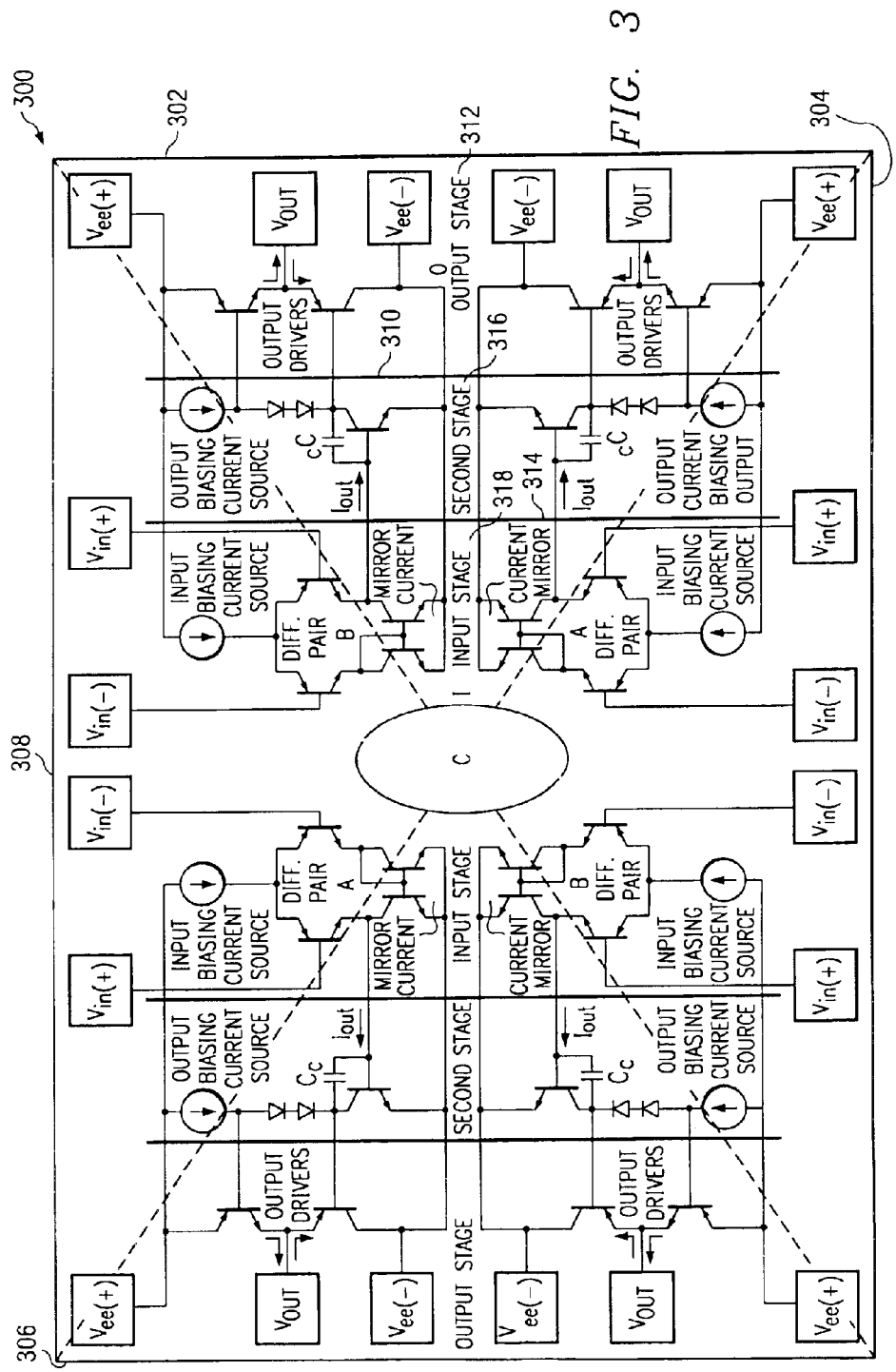
FIG. 3 is a detailed layout diagram showing input stages located near the common centroid, according to the present invention.

FIG. 3 is a detailed layout diagram of a semiconductor die 300 containing a quad op-amp according to one embodiment of the present invention. The die 300 has the common centroid C. The quad op-amp includes cross-coupled input stages ABBA, which are located near the common centroid C. Further, the die 300 has edges 302, 304, 306, and 308. A first solid line 310 divides the die 300 into an outer region 312, which is bounded by the edge 302. The outer region 312 contains the output stages O of the quad op-amp.

The die 300 further includes an intermediate region 316, which is bounded by the first solid line 310 and a second solid line 314. The intermediate region 316 contains the second (gain) stages G of the quad op-amp. The die 300 also includes an interior region 318, which is located between the second line 314 and the common centroid C. The interior region 318 contains the current mirror input stages I of the quad op-amp, which are located very close to the common centroid C. The input stages I are located such that they are substantially in the common centroid C of the die 300. Conventionally, the input stages I are not located in such a manner—that is, immediately adjacent the common centroid C.

The location of the input stages I, substantially in the common centroid C and in the interior region 318, rather than in the outer area 312 or toward the edges 302, 304, 306, and 308, or the corners thereof, reduces the amount of stress encountered by the input stages I. This results in an improved VIO performance post-package.

The placement of the input stages I corresponds to the ideal positioning of the input stages I of the op-amp. On the contrary, conventional input stages I may be located along the edges or corners of the die 300. Even if they are not located along the edges or corners of the die, conventionally, the input stages are not located substantially in the common centroid C.

Accordingly, the present invention optimizes the design/layout of operational amplifier devices by centralizing the current mirror input stages I. Typically, the stress on the current mirror input stages I causes large VIO variances (post-package). However, according to the one embodiment of the present invention, the technique of locating the input stages I near the common centroid C of the layout reduces the amount of stress encountered by the input stages I, which results in an improved VIO performance post-package.

Advantageously, the present invention improves the VIO yields during the final test, reduces the susceptibility to different or higher stress mold compounds, and minimizes the die size, since less trim circuitry is required. Further, the present invention takes "package stress" effects into account far in advance of packaging material. Accordingly, by taking design considerations into account up front, the present invention minimizes the development of "package stress" related yield issues in the future. The present invention is highly suitable for precision operational amplifiers.

In view of the above, it can be seen the present invention presents a significant advancement in the art of package stress reduction. Further, the present invention has been described in considerable detail in order to provide those skilled in the art with the information needed to apply the novel principles and to construct and use such specialized components as are required.

Moreover, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular amplifier types, the present inventive structures and characteristics are not necessarily limited to particular amplifier types or sets of characteristics as used herein. It shall be understood the embodiments described herein above can easily be implemented using many diverse amplifier types according to the inventive principles set forth herein above.

What is claimed is:

1. In a semiconductor die having an op-amp, a method of reducing package stress, which comprises the steps of:
   providing a semiconductor chip;
   locating the centroid of the semiconductor chip; and
   forming an op-amp having matched components in said semiconductor chip, the input stages of said matched components of the op-amp spaced apart and disposed at substantially the centroid of the semiconductor chip.

2. The method according to claim 1, wherein the centroid is substantially in the center of the die.

3. The method according to claim 1, wherein the matched components are current mirror input stages of the op-amp.

4. The method according to claim 1, wherein the op-amp is one of a single, dual, and quad op-amp.

5. The method according to claim 1, wherein the op-amp is a differential op-amp.

6. The method according to claim 1, which further comprises:
   disposing gain stages of the op-amp in an intermediate region of the die.

7. The method according to claim 1, which further comprises:
   disposing output stages of the op-amp in an outer region of the die.

8. A semiconductor configuration, comprising:
   a die having a centroid; and
   an op-amp in said die, said op-amp containing matched components having inputs, said inputs spaced apart and disposed at substantially said centroid.

9. The semiconductor configuration according to claim 8, wherein said centroid is substantially in the center of the die.

10. The semiconductor configuration according to claim 8, wherein said matched components are current mirror input stages.

11. The semiconductor configuration according to claim 8, wherein said op-amp is one of a single, dual, and quad op-amp.

12. The semiconductor configuration according to claim 8, wherein said die includes an intermediate region having gain stages.

13. The semiconductor configuration according to claim 8, wherein said die includes an outer region having output stages.

14. In a semiconductor device, a method of reducing package stress, which comprises the steps of:
   providing a semiconductor chip;
   locating the centroid of the semiconductor chip; and
   forming a device having matched components in said semiconductor chip, the input stages of said matched components spaced apart and disposed at substantially the centroid of the semiconductor chip.

15. The method according to claim 14, wherein the centroid is substantially in the center of the die.

16. The semiconductor configuration according to claim 14 wherein said device is an analog circuit.

17. A semiconductor configuration, comprising:
   a die having a centroid: and
   an op-amp in said die, said op-amp containing matched components having inputs, said inputs spaced apart and disposed at substantially said centroid.

18. The semiconductor configuration according to claim 17, wherein said centroid is substantially in the center of the die.

19. The semiconductor configuration according to claim 18 wherein said configuration is an analog circuit.

20. The semiconductor configuration according to claim 15 wherein said device is an analog circuit.

21. The semiconductor configuration according to claim 17 wherein said configuration is an analog circuit.

* * * * *